United States Patent
Guenther et al.

(10) Patent No.: US 7,877,249 B2
(45) Date of Patent: Jan. 25, 2011

(54) CONCEALMENT OF EXTERNAL ARRAY ACCESSES IN A HARDWARE SIMULATION ACCELERATOR

(75) Inventors: Gernot Eberhard Guenther, Endicott, NY (US); Vikto Gyuris, Wappingers Falls, NY (US); John Henry Westermann, Jr., Endicott, NY (US); Thomas John Tryt, Binghamton, NY (US)

(73) Assignee: International Business Machines Corporation, Armonk, NY (US)

( * ) Notice: Subject to any disclaimer, the term of this patent is extended or adjusted under 35 U.S.C. 154(b) by 1379 days.

(21) Appl. No.: 11/330,685

(22) Filed: Jan. 12, 2006

(65) Prior Publication Data

US 2007/0162270 A1    Jul. 12, 2007

(51) Int. Cl.
*G06F 9/45* (2006.01)
*G06F 9/455* (2006.01)
*G06F 9/44* (2006.01)
*G06F 13/00* (2006.01)
*G06F 13/14* (2006.01)
*G06G 13/18* (2006.01)

(52) U.S. Cl. .................. 703/22; 711/150; 711/151; 711/158

(58) Field of Classification Search ......... 711/151–152, 711/158
See application file for complete search history.

(56) References Cited

U.S. PATENT DOCUMENTS

| 5,812,878 | A  | * | 9/1998  | Christiansen et al. | 710/25  |
|-----------|----|---|---------|---------------------|---------|
| 6,226,709 | B1 | * | 5/2001  | Goodwin et al.      | 711/106 |
| 6,298,424 | B1 | * | 10/2001 | Lewchuk et al.      | 711/158 |
| 6,311,234 | B1 | * | 10/2001 | Seshan et al.       | 710/22  |
| 7,444,276 | B2 | * | 10/2008 | Watt et al.         | 703/15  |
| 2003/0088742 | A1 | * | 5/2003 | Lee et al.          | 711/147 |
| 2003/0105617 | A1 | * | 6/2003 | Cadambi et al.      | 703/14  |

OTHER PUBLICATIONS

MacKenzie, I. Scott. "The 6800 Microprocessor", 1995, Prentice Hall, 7 pages.*

* cited by examiner

*Primary Examiner*—Kamini S Shah
*Assistant Examiner*—Suzanne Lo
(74) *Attorney, Agent, or Firm*—Wood, Herron & Evans, LLP

(57) ABSTRACT

A circuit arrangement and method detect external requests to access a memory array in a hardware simulation accelerator during performance of a simulation on a simulation model and access the memory array without halting the simulation in response to detecting the external request. Such functionality may be provided, for example, by detecting such external requests in response to processing a predetermined instruction in an instruction stream associated with the simulation model, where the predetermined instruction is configured to ensure a predetermined period of inactivity for the memory array. By doing so, the memory array can be accessed from outside of the hardware simulation accelerator during the processing of a simulation, and without requiring that the simulation be halted, thus reducing overhead and improving simulation efficiency.

22 Claims, 3 Drawing Sheets

CONCEALMENT OF EXTERNAL ARRAY ACCESSES IN A HARDWARE SIMULATION ACCELERATOR

FIELD OF THE INVENTION

The invention is generally related to simulation of integrated and other electronic circuit designs. More specifically, the invention is generally related to providing external access to data in a hardware simulation accelerator.

BACKGROUND OF THE INVENTION

As semiconductor fabrication technology advances, designers of integrated circuits and electronic circuits incorporating the same are able to integrate more and more functions into individual integrated circuit devices, or chips. As such, electronic circuits that once required several integrated circuits electrically coupled to one another on a circuit board or module may now be integrated into fewer integrated circuits, thereby increasing performance and reducing cost.

With increases in integrated circuit complexity, however, the processes of designing and testing integrated circuit designs become increasingly complex and time consuming. As a result, computers have become increasingly important in automating the design and testing of integrated circuits.

An important step in the development of a complex electronic system is that of verification, which may be used to verify the functional operation of a logic design for an integrated circuit. Traditionally, integrated circuits have been designed on a computer at a relatively high level of abstraction, typically in a hardware definition language such as VHDL or Verilog. Software tools, known as compilers, are then used to generate simulation models for the integrated circuits that can be executed on a logic simulator computer program to simulate the reactions of such circuits to various input conditions. By simulating the functional operation of an integrated circuit, potential errors or faulty logic can be identified and corrected in the high level logic design. Simulation is then rerun until the logic design functions as desired.

However, with the increasingly complex nature of many logic designs, software-based simulation is often too time consuming and inefficient. As a result, a significant amount of development effort has been directed toward hardware-based verification environments such as hardware-based logic simulators. Logic simulation of a logic design is often performed using a massively parallel hardware-based simulation accelerator incorporating hundreds or thousands of "logic processors" that are used to simulate, in hardware, the various functional components of a logic design. The logic processors can be specifically designed to efficiently simulate various functional components, and thus permit the simulation of potentially millions of logic gates in substantially less time than would be required for software-based simulation.

With a hardware-based simulation accelerator, a logic design to be simulated is typically in the form of a gate-level model that has been compiled from a high-level language. The compiled model breaks up each clock cycle (also referred to as an evaluation cycle) into a series of evaluation instructions or "steps". The evaluation steps are typically executed in-order on each logic processor, and are repeated during each evaluation cycle.

One issue that arises in connection with some conventional hardware-based simulation accelerators is associated with the collection of simulation data during the simulation of a hardware design. For example, it may be desirable to collect a snapshot of a simulation at various points in time, or to check the status of certain data, prior to the completion of a simulation, particularly if the simulation is complex and expected to run for several hours. To this extent, some accelerator designs support the ability to store data in one or more memory arrays during a simulation, as well as the ability to access the memory arrays from outside an accelerator over an interface such as a service channel interface. Typically, the arrays are not primarily used for this purpose, but rather are principally used to simulate embedded arrays in a hardware design, or external arrays that may be accessed by a hardware design in normal usage.

By design, array accesses in an instruction-based hardware simulation accelerator typically need to be deterministic. Put another way, any access that is initiated in a given instruction is expected to be completed within a fixed number of cycles. Delays or interruptions as a result of external (i.e., service channel) accesses typically cannot be tolerated. As a result, in conventional accelerator designs providing external access capability, the only means of accessing these arrays from outside the simulator is to stop the simulation, perform the access(es), and then restart the simulation. Otherwise, a risk would exist that an external access to a memory array would prevent the completion of an internal array access within the designated number of cycles.

Stopping a simulation, however, adds overhead and reduces simulation efficiency, and is therefore undesirable. A significant need therefore continues to exist in the art for a manner of facilitating the performance of external array accesses in a hardware simulation accelerator with reduced impact on the execution of the accelerator.

SUMMARY OF THE INVENTION

The invention addresses these and other problems associated with the prior art by providing a circuit arrangement and method that detect external requests to access a memory array in a hardware simulation accelerator during performance of a simulation on a simulation model and access the memory array without halting the simulation in response to detecting an external request. In some embodiments of the invention, for example, such functionality may be provided by detecting such external requests in response to processing a predetermined instruction in an instruction stream associated with the simulation model, where the predetermined instruction is configured to ensure a predetermined period of inactivity for the memory array. By doing so, the memory array can be accessed from outside of the hardware simulation accelerator during the processing of a simulation, and without requiring that the simulation be halted, thus reducing overhead and improving simulation efficiency.

These and other advantages and features, which characterize the invention, are set forth in the claims annexed hereto and forming a further part hereof. However, for a better understanding of the invention, and of the advantages and objectives attained through its use, reference should be made to the Drawings, and to the accompanying descriptive matter, in which there is described exemplary embodiments of the invention.

DETAILED DESCRIPTION

Embodiments consistent with the invention effectively conceal external array accesses in a hardware simulation accelerator by processing such array accesses in a deterministic manner that does not require halting of the execution of a simulation. As such, arrays in a hardware simulation accelerator can be externally accessed (e.g., from a service channel) without having to stop the simulator, thus providing significantly greater efficiency and reduced overhead during execution of a hardware simulation accelerator.

In the embodiments discussed hereinafter, a mechanism is provided within a hardware simulation accelerator to facilitate external read/write accesses to a memory array while the simulator is actively running, which mechanism is responsive to a unique service channel command that specifies the operation (read or write), address, and data (for writes) for a given external access request. The command is serviced by the accelerator during "forecast" operations that are compiled into the instruction stream of a simulation model under test. These operations, which may also be used to allow time for refresh activity, guarantee a fixed period of memory array inactivity which can also be used to access the array without interfering with simulation.

Figure 1:
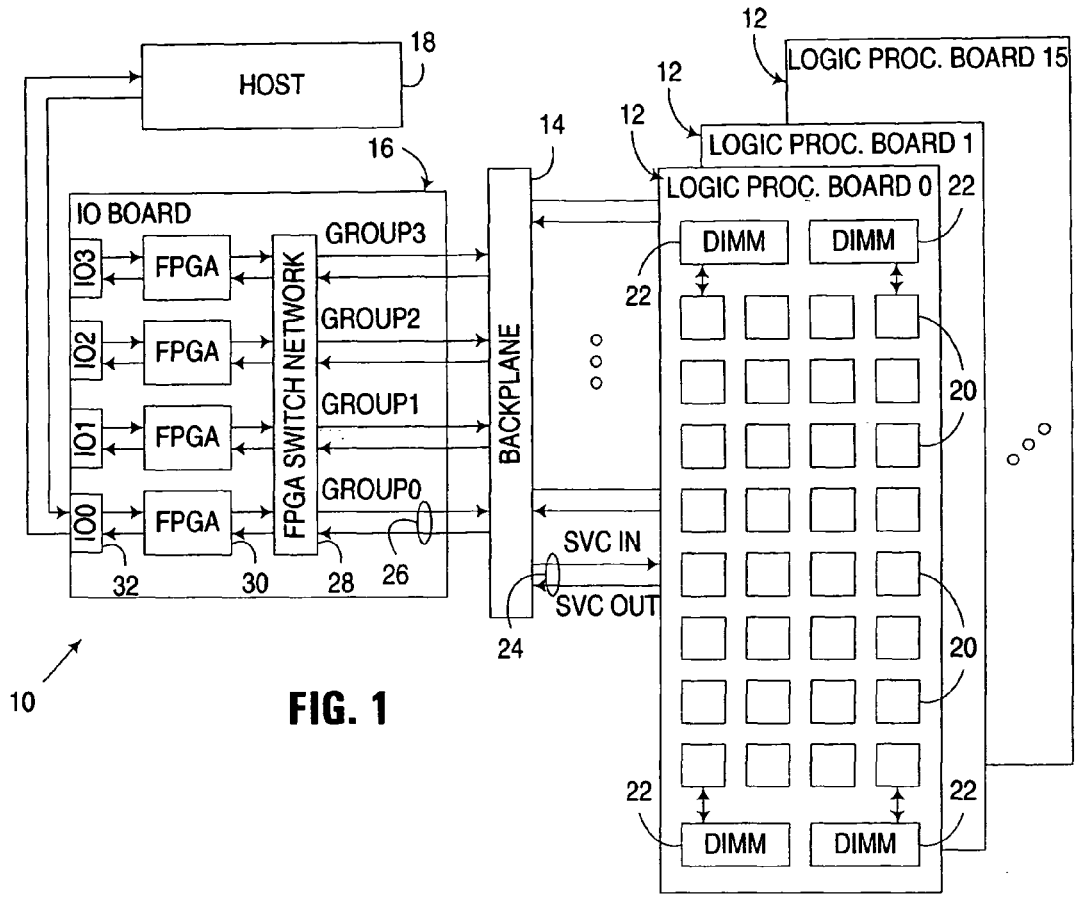
FIG. 1 is a block diagram of a hardware-based simulation accelerator incorporating external array access logic consistent with the invention.

Turning to the Drawings, wherein like numbers denote like parts throughout the several views, FIG. 1 illustrates a hardware-based simulation accelerator 10 consistent with the invention. Accelerator 10 may be based, for example, on the AWAN instruction-based simulation accelerator architecture developed by International Business Machines Corporation, and may include a plurality of logic processor boards 12 (e.g., up to 16 boards) coupled to a backplane 14. Accelerator 10 also includes an IO board 16 additionally coupled to backplane 14 and providing external access to accelerator 10 by a host 18 (e.g., a computer or workstation). Accelerator 10 may be massively parallel in nature, and as such, each logic processor board 12 may include an array of logic processor integrated circuit devices or chips 20 (e.g., 32), each with a plurality of embedded logic processors, e.g., 64 logic processors, with each logic processor capable of simulating a 4-input logic gate in a single instruction (thus providing 2048 logic processors per board). In some embodiments, multiple backplanes 14 may be coupled to one another to provide additional simulation capacity.

Each logic processor board 12 additionally includes a plurality of memory arrays, to which a subset of the logic processor chips 20 are coupled, e.g., four 512 MB DIMM's 22 that are respectively coupled to four of the logic processor chips 20. As will be discussed in greater detail below, it is within memory arrays 22 that simulation data may be stored during performance of a simulation.

In addition, accelerator 10 provides a mechanism for performing external accesses to such memory arrays during performance of a simulation. In particular, a service channel 24 including in and out communication paths is provided on each board 12, and is distributed to each logic processor integrated circuit 20.

IO board 16 in turn includes four service channel groups 26 (e.g., for boards 0-3, 4-7, 8-11 and 12-15) that are routed to an FPGA switch network 28 that interfaces four FPGA's 30 to the service channel groups 26. Each FPGA 30 is coupled to one of four ports 32, one of which is shown coupled to host 18. Each port 32 may provide, for example, a pair of LVDS Tx/Rx ports, and each FPGA 30 may be configured to validate incoming packets from the host and package response data to send back to the host. System partitioning may also be supported, whereby switch network 28 may be used to enable different hosts to communicate with different logic processor boards over the respective group 26.

Accelerator 10 is an instruction-based hardware simulator, and is configured to process a simulation model for a logic design (e.g., a VLSI design), typically taking the form of a gate-level compiled model of the logic design, which may be generated, for example, on the host workstation 18 and downloaded to the logic processor chips 20 over the service channel.

Figure 2:
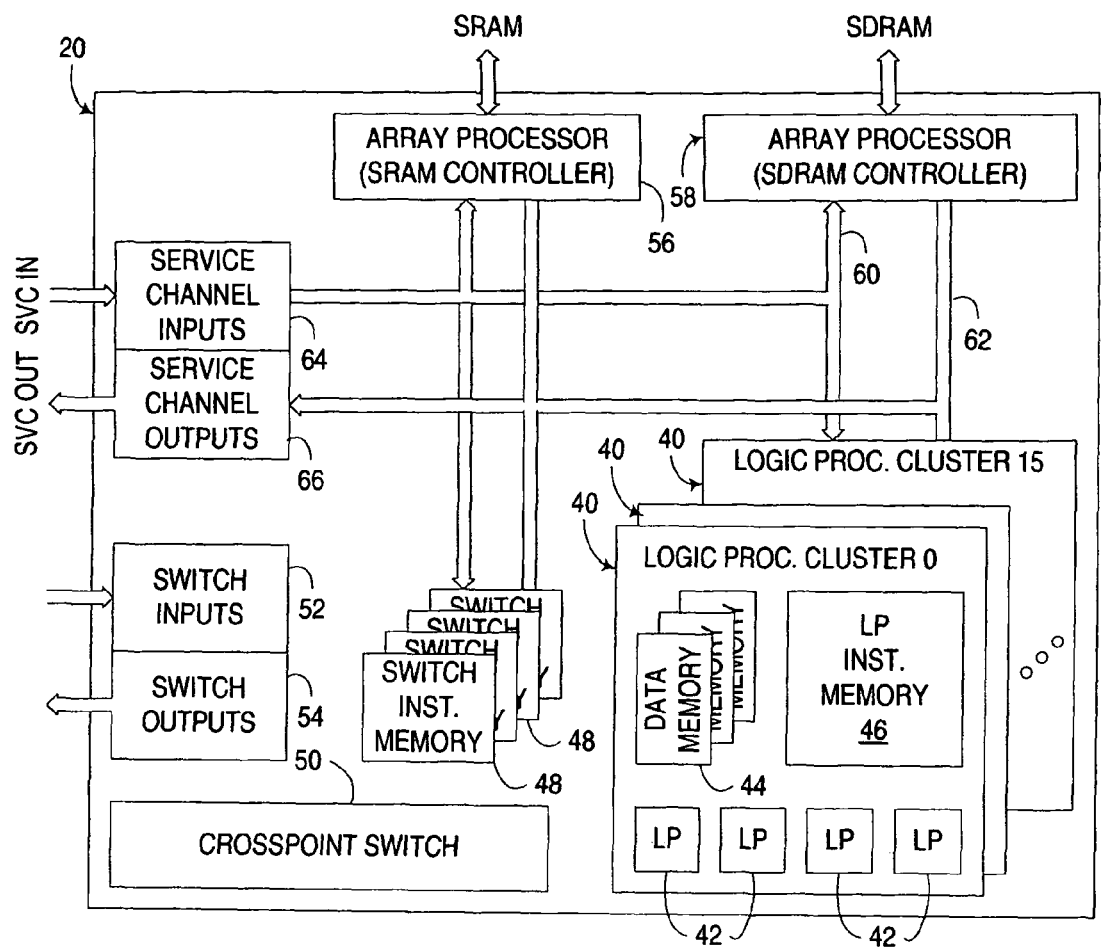
FIG. 2 is a block diagram of one of the logic processor integrated circuits referenced in FIG. 1.

FIG. 2 illustrates the principal components in each logic processor integrated circuit or chip 20 in greater detail. The architecture includes a plurality (e.g., 16) of logic processor clusters 40, each including four logic processors 42, three embedded SRAM arrays or data memories 44 and an embedded DRAM macro or instruction memory 46. Additionally, four switch instruction memory arrays 48 are provided along with a crosspoint switch 50, a switch input block 52 and a switch output block 54, which are used for routing signals between logical processors on the same and/or different logical processor integrated circuits.

Also provided are a pair of array processors 56, 58, the former of which being used to access an SRAM array and the latter being used to access an SDRAM array, each in connection with modeling arrays during simulation. It is within SDRAM array controller or array processor 58 that external accesses are processed in this embodiment in a manner consistent with the invention.

Internal service channel input and output paths 60, 62 are provided in logic processor chip 20, and are used to distribute the service channel to the components within the chip from a service channel interface including input and output interface blocks 64, 66. In the illustrated embodiment, external access requests for a memory array are passed through interface block 64 and over service channel path 60 to a circuit arrangement in array processor 58, while responses to such external access requests are returned by the circuit arrangement in array processor 58 over service channel path 62 and through interface block 66.

It will be appreciated that other hardware simulation accelerator architectures may be utilized in the alternative. Moreover, different partitioning of logic processors among chips and boards differing from that illustrated in FIG. 1. Furthermore, additional electronic components, e.g., I/O cards, memory, data capture cards, etc., may also be incorporated into a hardware simulation accelerator consistent with the invention. Furthermore, other interconnects between logic processors may also be used in the alternative. Thus, the invention is not limited to the particular environment discussed herein.

Figure 3:
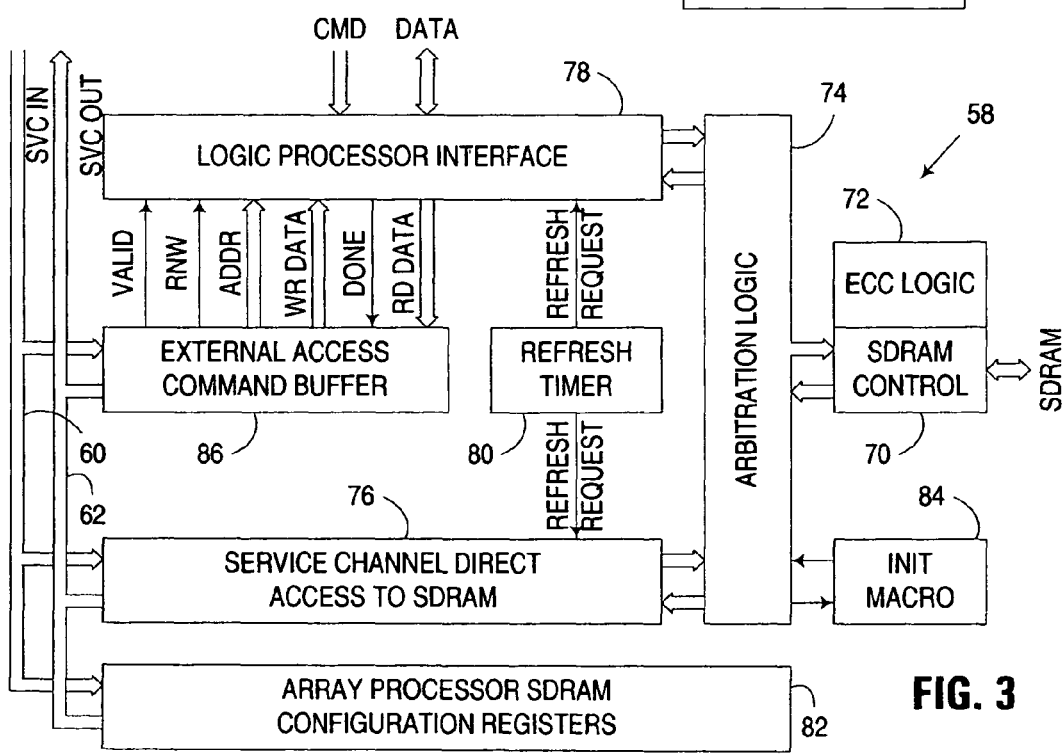
FIG. 3 is a block diagram of the array processor referenced in FIG. 2.

The principal architectural components in array processor 58 are illustrated in greater detail in FIG. 3. Access to the SDRAM memory array is provided by an SDRAM control block 70, which functions as a memory array interface, and may additionally include ECC logic 72. Access to block 70 is in turn provided by arbitration logic 74 that arbitrates between a service channel direct access block 76, which allows for direct access to the SDRAM over the service channel when accelerator 10 is not actively performing a simulation, and a logic processor interface block 78, which provides access to the memory array for the 64 logic processors on the integrated circuit.

A refresh timer 80 is coupled to each of blocks 76, 78, and outputs a refresh request signal to indicate to each block that a refresh of the memory array is needed. Timer 80 is reset to a refresh interval after each refresh of the memory array, and asserts the refresh request signal whenever the timer expires. One benefit of such a timer, when used in connection with the forecast instructions discussed below, is that the refresh interval may be configured via a configuration register, rather than requiring a simulation model to be recompiled to use a different refresh interval.

Also provided in array processor 58 is a set of SDRAM configuration registers 82, which store configuration information such as the refresh interval, initialization parameters, and SDRAM device-specific interface timings such as CAS latency. An initialization macro block 84 is also provided to issue the required initialization sequence to the SDRAM device.

Array processor 58 also includes an external access command buffer 86, which is coupled between service channel 60, 62 and logic processor interface block 78, and which provides a command buffer through which external accesses consistent with the invention may be implemented.

In the illustrated embodiment, buffer 86 includes three registers, a 32-bit address control register and a pair of 32-bit data registers, which together provide a 64-bit data buffer through which write data is received and read data is output over the service channel. While other bit mappings may be used, one suitable mapping for the control register is shown in Table I below:

TABLE I

Control Register Bit Mapping

| Bit | Name | Description |
| --- | --- | --- |
| 31 | Reserved | |
| 30:3 | Address (R/W) | contains target address of external array access operation |
| 2 | Read-Not-Write (R/W) | 0 - write access<br>1 - read access |
| 1 | Valid (R/W) | 0 - no operation pending<br>1 - operation valid<br>*Setting bit to 1 validates external array operation specified in register, bit reset when register read when Done = 1 |
| 0 | Done (R) | 0 - operation not complete<br>1 - operation complete<br>*Set by array processor when external array operation specified in register is complete, bit reset when register read when Done = 1 |

As noted above, array processor 58, within which external access to a memory array is provided in a manner consistent with the invention, implements a circuit arrangement that is implemented on a logic processor integrated circuit or chip utilized in a hardware simulation accelerator. It will be appreciated that, in the alternative, the functionality described herein in connection with providing external access to a memory array may be implemented on multiple integrated circuit devices.

It should also be recognized that circuit arrangements are typically designed and fabricated at least in part using one or more computer data files, referred to herein as hardware definition programs, that define the layout of the circuit arrangements on integrated circuit devices. The programs are typically generated in a known manner by a design tool and are subsequently used during manufacturing to create the layout masks that define the circuit arrangements applied to a semiconductor wafer. Typically, the programs are provided in a predefined format using a hardware definition language (HDL) such as VHDL, Verilog, EDIF, etc. Thus, while the invention has and hereinafter will be described in the context of circuit arrangements implemented in fully functioning integrated circuit devices, those skilled in the art will appreciate that circuit arrangements consistent with the invention are capable of being distributed as program products in a variety of forms, and that the invention applies equally regardless of the particular type of computer readable signal bearing media used to actually carry out the distribution. Examples of computer readable media include but are not limited to tangible, recordable type media such as volatile and non-volatile memory devices, floppy disks, hard disk drives, CD-ROM's, and DVD's, among others, and transmission type media such as digital and analog communications links.

Figure 4:
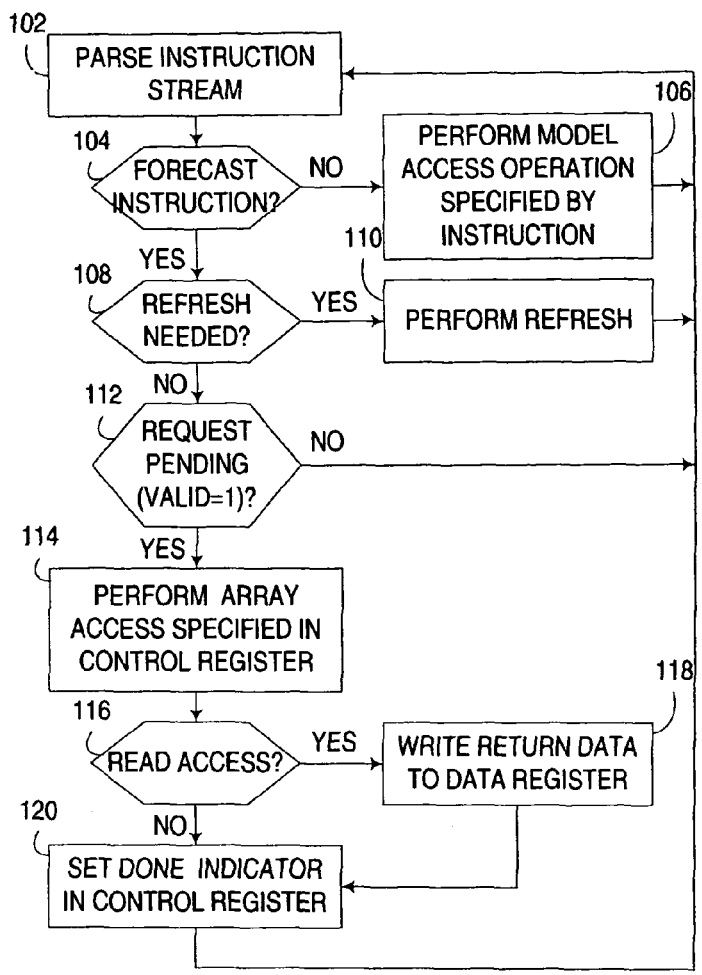
FIG. 4 is a flowchart illustrating the program flow of the logic processor interface referenced in FIG. 3 in processing an instruction stream during simulation.

Now turning to FIG. 4, the operation of logic processor interface block 78 of array processor 58 of FIG. 3 in processing an instruction stream from a simulation model is described in greater detail. In particular, FIG. 4 illustrates an instruction processing routine 100 that processes instructions from an instruction stream that are associated with array processor 58. As is known in the art, an instruction-based hardware simulation accelerator performs a simulation by executing instructions associated with a simulation model for a logic design being simulated. The simulation model takes the form of an instruction stream that includes instructions assigned to various logic processors and array processors in the accelerator. The instruction stream is executed in full for each evaluation step or cycle in the simulation, and as a result, the instruction stream represents the operations performed by the various logic processors and array processors in processing a single evaluation step for a simulation. Those instructions that are assigned to each logic processor and array processor are loaded into each such processor and executed by that processor for each evaluation step.

The instruction stream generated for a simulation model is generated from a compilation operation. Furthermore, in embodiments consistent with the invention, such compilation results in the insertion of instructions referred to herein as "forecast" instructions at periodic intervals and assigned to each of the active array processors in the accelerator. Such instructions are inserted into an instruction stream during compilation to provide a guarantee to an array processor that the array processor will not be accessed by a logic processor for a fixed period of time. Typically, array processors do not process as many instructions per evaluation step as a typical logic processor, and as a result, the insertion of forecast instructions typically does not have an appreciable effect on the workload of an array processor.

One purpose of such forecast operations is to ensure that a sufficient period of nonuse will be reserved for performing array refreshes, as are required for dynamic logic memory arrays. As such, in some embodiments, it may be desirable to simply insert forecast instructions into empty slots in the instruction stream assigned to an array processor, rather than attempting to insert the instructions at defined intervals, so long as forecast instructions will be encountered with sufficient frequency to ensure that refreshing of the memory array is performed in a timely manner.

A second purpose of such forecast operations is to provide a window for checking whether any external accesses to a memory array are pending, and if so, for completing such accesses prior to any internal accesses of the memory array are requested by a logic processor. It will be appreciated that in other embodiments, separate instructions may be provided for supporting refresh operations and external array access operations. Also, in other embodiments, external accesses may be prioritized over refreshes, unlike the embodiments described herein where refreshes are prioritized over external accesses.

The herein-described embodiments rely on a request posting and polling mechanism for enabling an external requester to issue external requests, or commands, to a memory array, detect completion of the commands, and, if appropriate, receive requested data in response to detecting completed commands. Whenever an external requester wishes to issue a command to access the memory array, the requester writes the external request into the control register for the external access command buffer (additionally writing data into the data registers if a write command). In connection with writing the request into the command buffer, the valid bit is set in the control register, indicating to the array processor that a request is pending.

In addition, whenever an array processor detects a forecast instruction in its assigned instruction stream, the array processor checks the valid bit in the external access command buffer, and if set, initiates a transaction on the memory array to perform the external access request specified in the buffer. Once processing of the request is complete, the array processor sets the Done bit in the control register, and if a read operation, stores the read data returned by the memory array in the data registers. The Done bit serves as a completion indicator that indicates when processing of a request by the memory array is complete.

Asynchronously with respect to the array processor, the external requester may poll the control register for the external access command buffer to determine when the request has been processed. In particular, if the request is not yet complete, the Done indicator will not be set, and this information will be returned to the requester over the service channel. However, if the Done indicator is set when polled, the array processor will reset the Done and Valid indicators, and return this information to the external requester. In addition, if the request was a read request, the read data may be burst over the service channel automatically in response to the polling request. In other embodiments, the polling of the Done indicator, and the return of the read data, may occur in separate operations.

As such, FIG. 4 shows the manner in which an instruction stream is processed by an array processor. Routine 100 begins in block 102 and checking in block 104 whether the instruction is a forecast instruction. If not, control passes to block 106 to handle the instruction in an appropriate manner. For an array processor, the types of instructions that may be encountered include dense accesses that read/write data from/to specific addresses in the memory array for the purpose of simulating read and write accesses in an actual logic design, sparse accesses that simulate accesses to more memory than is physically available, and trace operations that write status information about a simulation in progress to the memory array (e.g., to generate an All Events Trace (AET)). Once such instructions are processed, control returns to block 102 to process the next instruction in the instruction stream.

Returning to block 104, if the instruction is a forecast instruction, control passes to block 108 to determine whether a refresh is needed, e.g., by checking whether the refresh request signal has been asserted by the refresh timer. If so, control passes to block 110 to perform the refresh, in a manner known in the art. Control then returns to block 102. Otherwise, block 108 passes control to block 112 to determine whether an external request is pending, typically by checking the Valid bit in the external access command buffer control register. If no request is pending, nothing needs to be done for the forecast instruction, so control passes back to block 102 to process the next instruction in the instruction stream.

Otherwise, if a request is pending, block 112 passes control to block 114 to perform the array access operation as specified in the control register for the external access command buffer. Block 116 then determines whether the access was a read access, and if so, passes control to block 120 to write the return data received from the memory array to the data registers for the external access command buffer. Control then passes to block 120 to set the Done indicator in the control register for the external access command buffer, thus signifying that the external request has been completed. Control then returns to block 102 to process the next instruction in the instruction stream. Returning to block 116, if the access was for a write access, rather than a read access, block 118 is bypassed, and control passes directly to block 120. As such, the Done indicator is set without writing any data to the data registers.

Figure 5:
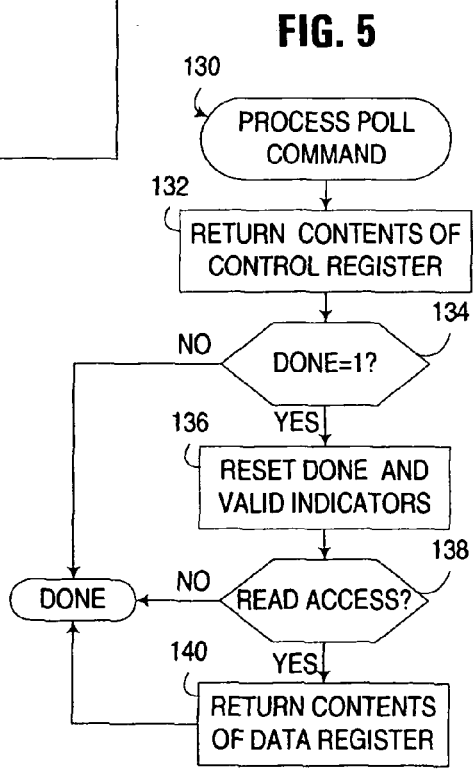
FIG. 5 is a flowchart illustrating the program flow of the external access command buffer in FIG. 3 in processing a poll command received over the service channel interface.

As noted above, a polling mechanism is utilized to enable an external access request to be completed. In this regard, FIG. 5 illustrates a process poll command routine 130 performed by external access command buffer 86 of FIG. 3 to process a poll command received over the service channel interface from an external requester. The poll command may take the form of a read request to the control register for the external access command buffer.

Routine 130 begins in block 132 by returning the contents of the control register to the external requester over the service channel. From these contents, the external requester will be able to make an independent determination as to whether the request is complete, by checking the Done indicator.

Next, block 134 determines whether the Done indicator is currently set. If not, no further processing of the poll command is required, and routine 130 is complete. Otherwise, if the indicator is set, control passes to block 136 to reset the Done and Valid indicators to indicate that the request is complete and the command buffer is now available for posting of a new request from an external requester. Block 138 then determines whether the request was a read request, and if so, control passes to block 140 to burst the contents of the data register to the external requester over the service channel, whereby routine 130 is then complete. Returning to block 138, if the request was a write request, block 140 is bypassed, and routine 130 is complete.

Consequently, an external requester, in receiving a response to the read of the control register, is able to independently and asynchronously confirm whether the external array access has been successfully completed. Furthermore, in the case of a read request, the external requester receiving control register contents that indicate that the read request has been completed receives the burst of the read data immediately following the contents of the control register.

As a result, embodiments consistent with the invention enable external accesses to be made to an internal memory array in a hardware simulation accelerator without requiring a currently executing simulation to be halted. Various modifications will be apparent to one of ordinary skill in the art. Therefore, the invention lies in the claims hereinafter appended.

What is claimed is:

1. A method of performing a hardware simulation in a hardware simulation accelerator, the method comprising:
    performing a simulation on a simulation model for a hardware design using a hardware simulation accelerator;
    during performance of the simulation, detecting an external request to access a memory array disposed within the hardware simulation accelerator, wherein the external request originates outside of the hardware simulation accelerator, and wherein the memory array is used to simulate an array accessed by the hardware design; and
    accessing the memory array without halting the simulation in response to detecting the external request;
    wherein detecting the external request is performed in response to processing a predetermined instruction in an instruction stream associated with the simulation model, and wherein the predetermined instruction is configured to ensure a predetermined period of inactivity for the memory array.

2. The method of claim 1, further comprising, in response to processing the predetermined instruction, initiating a refresh of the memory array.

3. The method of claim 1, wherein detecting the external request is performed in response to processing a predetermined instruction and only if a determination is made that no refresh is required.

4. The method of claim 1, wherein the predetermined instruction is inserted into the instruction stream during compilation of the simulation model.

5. The method of claim 1, wherein the hardware simulation accelerator includes a plurality of integrated circuit devices, with each integrated circuit device including a plurality of logical processors and an array processor, wherein the array processor in a first integrated circuit device among the plurality of integrated circuit devices is configured to access the memory array, and wherein the predetermined instruction is disposed in an instruction stream associated with the array processor in the first integrated circuit device.

6. The method of claim 1, wherein the hardware simulation accelerator includes an external interface and a control register accessible over the external interface, Wherein the external request is received over the external interface, and wherein accessing the memory array includes setting a completion indicator in the control register after accessing the memory array.

7. The method of claim 6, wherein the external interface includes a service channel interface configured to be coupled to a service channel, and wherein the external request comprises a command issued over the service channel.

8. The method of claim 7, further comprising automatically resetting the completion indicator in the control register in response to a second external request that checks the completion indicator.

9. The method of claim 8, wherein the external request is a read request, wherein the hardware simulation accelerator further includes a data register accessible over the external interface, and wherein accessing the memory array further includes storing data retrieved from the memory array in the data register, the method further comprising automatically outputting the data stored in the data register over the external interface in response to the second external request.

10. A method of performing a hardware simulation in a hardware simulation accelerator, the method comprising:
 performing a simulation on a simulation model for a hardware design using an instruction-based hardware simulation accelerator;
 during performance of the simulation, processing an instruction stream associated with the simulation model, including processing a predetermined instruction in the instruction stream that is configured to ensure a predetermined period of inactivity for a memory array disposed within the hardware simulation accelerator, wherein the memory array is used to simulate an array accessed by the hardware design;
 in response to processing the predetermined instruction in the instruction stream, checking for a pending external request to access the memory array, wherein the external request originates outside of the hardware simulation accelerator; and
 accessing the memory array in response to detecting the external request.

11. The method of claim 10, wherein, accessing the memory array is performed without halting the simulation.

12. A circuit arrangement configured for use in a hardware simulation accelerator, the circuit arrangement comprising:
 an array interface configured to provide access to a memory array in a hardware simulation accelerator, wherein the memory array is used to simulate an array accessed by a hardware design; and
 a logic circuit coupled to the array interface and configured to detect an external request to access the memory array during performance of a simulation on a simulation model for the hardware design using the hardware simulation accelerator, and access the memory array without halting the simulation in response to detecting the external request, wherein the external request originates outside of the hardware simulation accelerator;
 wherein the logic circuit is configured to detect the external request in response to processing a predetermined instruction in an instruction stream associated with the simulation model, wherein the predetermined instruction is configured to ensure a predetermined period of inactivity for the memory array.

13. The circuit arrangement of claim 12, wherein the logic circuit is further configured to detect the external request in response to processing the predetermined instruction and only if a determination is made that no refresh is required.

14. The circuit arrangement of claim 12, wherein the predetermined instruction is inserted into the instruction stream during compilation of the simulation model.

15. The circuit arrangement of claim 12, wherein the circuit arrangement is disposed in an array processor in an integrated circuit device that additionally includes a plurality of logical processors, and wherein the predetermined instruction is disposed in an instruction stream associated with the array processor.

16. The circuit arrangement of claim 12, further comprising an external interface and a control register accessible over the external interface, wherein the external request is received over the external interface, and wherein the logic circuit is configured to access the memory array by setting a completion indicator in the control register after accessing the memory array.

17. The circuit arrangement of claim 16, wherein the external interface includes a service channel interface configured to be coupled to a service channel, and wherein the external request comprises a command issued over the service channel.

18. The circuit arrangement of claim 17, wherein the logic circuit is further configured to automatically reset the completion indicator in the control register in response to a second external request that checks the completion indicator.

19. The circuit arrangement of claim 18, further comprising a data register accessible over the external interface, wherein the external request is a read request, and wherein the logic circuit is configured to access the memory array by storing data retrieved from the memory array in the data register, and to automatically output the data stored in the data register over the external interface in response to the second external request.

20. An integrated circuit device comprising the circuit arrangement of claim 12.

21. A hardware simulation accelerator comprising the circuit arrangement of claim 12.

22. A program product, comprising a recordable type computer readable medium bearing a hardware definition program that defines the circuit arrangement of claim 12.

* * * * *